(12) United States Patent
Zhang et al.

(10) Patent No.: US 9,107,328 B2
(45) Date of Patent: Aug. 11, 2015

(54) PCB FOR LCD DEVICE AND LCD DEVICE

(75) Inventors: Xianming Zhang, Shenzhen (CN);
Xiang Yang, Shenzhen (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 82 days.

(21) Appl. No.: 13/574,416

(22) PCT Filed: Jun. 15, 2012

(86) PCT No.: PCT/CN2012/076988
§ 371 (c)(1),
(2), (4) Date: Jul. 20, 2012

(87) PCT Pub. No.: WO2013/185342
PCT Pub. Date: Dec. 19, 2013

(65) Prior Publication Data
US 2013/0335923 A1    Dec. 19, 2013

(30) Foreign Application Priority Data

Jun. 13, 2012  (CN) .......................... 2012 1 0194406

(51) Int. Cl.
H05K 1/00 (2006.01)
H05K 7/20 (2006.01)
(52) U.S. Cl.
CPC .................................. H05K 7/20963 (2013.01)
(58) Field of Classification Search
USPC ......... 174/252, 250, 251, 254, 255, 258, 260, 174/261
See application file for complete search history.

(56) References Cited

U.S. PATENT DOCUMENTS

| 5,036,897 A | * | 8/1991 | Tamura et al. | 216/27 |
| 2002/0090209 A1 | * | 7/2002 | VonArx et al. | 392/451 |
| 2012/0104268 A1 | * | 5/2012 | Burr et al. | 250/370.09 |
| 2012/0139561 A1 | | 6/2012 | Iwamoto et al. | |

FOREIGN PATENT DOCUMENTS

| CN | 2701073 Y | 5/2005 |
| CN | 1800925 A | 7/2006 |
| JP | 2009049213 A | 3/2009 |
| WO | WO2004049543 A1 | 6/2004 |

OTHER PUBLICATIONS

Machine Translation for Japanese Patent Publication No. 2009-049213 (Mar. 5, 2009).*
Han Xu, the International Searching Authority written comments, Mar. 2013, CN.

* cited by examiner

Primary Examiner — Tremesha S Willis
(74) Attorney, Agent, or Firm — IPro, Inc.; Na Xu

(57) ABSTRACT

The invention relates to the field of LCDs, and more particularly to a PCB for an LCD device and an LCD device. The PCB includes a front face and a back face; the front face of the PCB is a face for densely arranging components, and the back face is a face without densely arranged components; the back face of the PCB is provided with a jumper wire for dissipating heat, and the jumper wire is connected with a terminal of the component. The heat of the component is transmitted to the jumper wire by the terminal, and the jumper wire is used for auxiliarily strengthening heat dissipation. Thus, the heat is rapidly transmitted, and the heat dissipating effect is significantly improved.

13 Claims, 2 Drawing Sheets

PCB FOR LCD DEVICE AND LCD DEVICE

CROSS REFERENCE TO RELATED APPLICATION(S)

This application is a national stage entry of international patent application PCT/CN12/76988, filed on Jun. 15, 2012, and claims priority to Chinese patent application 201210194406.9, filed on Jun. 13, 2012.

TECHNICAL FIELD

The invention relates to the field of liquid crystal displays (LCDs), and more particularly to a printed circuit board (PCB) for an LCD device and an LCD device.

BACKGROUND

An LCD device includes a plurality of PCBs such as a power board, a master control board, an interface board, a key board, a remote control board, etc. Some PCBs are provided with many circuits and components. The LCD devices are designed to be thinner, and the PCBs are designed to be thinner and smaller. Thus, the components on the PCBs are densely arranged, and the heat dissipating area is insufficient, resulting in the overhigh temperature of some components, and affecting the performance of the PCBs. Especially, the component with high heat productivity such as an IC (integrated circuit), a metal oxide semiconductor transistor (MOS transistor), etc. on the power board and the master control board are easier to be damaged because of overhigh temperature, thereby requiring to improve the heat dissipating performance of PCBs.

SUMMARY

In view of the above-described problems, the aim of the invention is to provide a PCB for an LCD device and an LCD device with good heat dissipating effect.

A first technical scheme of the invention is that: a PCB for an LCD device comprises a front face and a back face; the front face of the PCB is a face for densely arranging components, and the back face is a face without densely arranged components. The back face of the PCB is provided with a jumper wire for dissipating the heat, the jumper wire is connected with a terminal of the component, and is formed by etching a copper film of the back face of the PCB. The jumper wire is a bare metal wire. The same signal ends of a plurality of components are connected via the jumper wire, or common ground ends of a plurality of components are connected via the jumper wire. The number of the jumper wire is multiple, the component is an IC and/or a MOS transistor, and the PCB for the LCD device is a power board or a master control board.

A second technical scheme of the invention is that: a PCB for an LCD device comprises a front face and a back face; the front face of the PCB is a face for densely arranging components, and the back face is a face without densely arranged components. The back face of the PCB is provided with a jumper wire for dissipating the heat, the jumper wire is connected with a terminal of the component.

Preferably, the jumper wire is formed by etching a copper film of the back face of the PCB, namely the jumper wire is formed when manufacturing a circuit of the back face of the PCB; thus, the process is not added, and the cost is not added basically.

Preferably, the jumper wire is a bare metal wire; thus, the heat dissipating effect is very good.

Preferably, the jumper wire is covered with a heat-conducting insulating layer, thereby preventing the jumper wire from being in contact with other metal parts to cause a short circuit.

Preferably, the same signal ends of a plurality of components are connected via the jumper wire, or common ground ends of a plurality of components are connected via the jumper wire.

Preferably, the jumper wire is not connected with the terminals of other components any longer.

Preferably, the number of the jumper wire is multiple.

Preferably, the component is an IC and/or a MOS transistor. The IC and MOS transistor are the component with high heat productivity, and should be selected preferentially to use the jumper wire to dissipate the heat.

Preferably, the PCB for the LCD device is a power board or a master control board.

The invention further provides a third technical scheme: an LCD device comprises the PCB mentioned above.

Advantages of the invention are summarized below: the front face of the PCB of the invention is the face for densely arranging components, and the back face is the face without densely arranged components. The back face of the PCB is provided with the jumper wire, the jumper wire is connected with the terminal of the component, the heat of the component is transmitted to the jumper wire by the terminal, and the jumper wire is used for auxiliarily strengthening heat dissipation. Because the back face of the PCB is the face without densely arranged components, the temperature of the back face is lower than that of the front face of the PCB, and the temperature difference between the jumper wire and the environmental of the back face of the PCB is large. Thus, the heat is rapidly transmitted, and the heat dissipating effect is significantly improved.

Legends: 1. IC; 2. jumper wire; 3. branch jumper wire.

DETAILED DESCRIPTION

Figure 1:
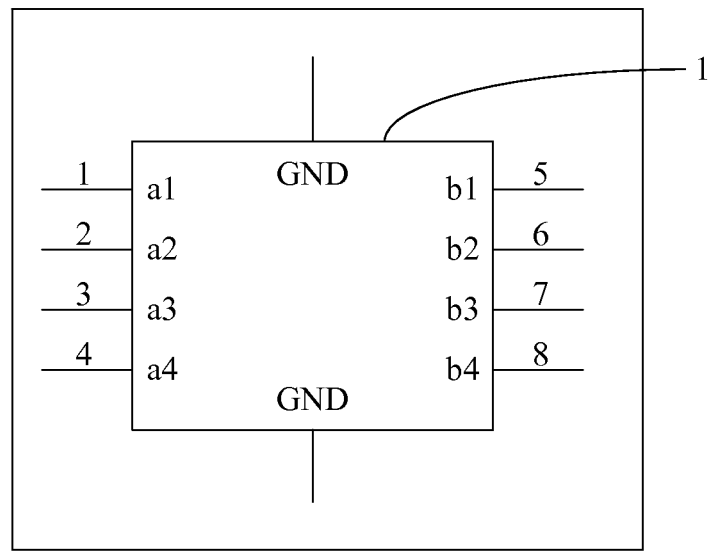
FIG. 1 is a schematic view of a front face of a PCB for an LCD device of a first example of the invention.
Figure 2:
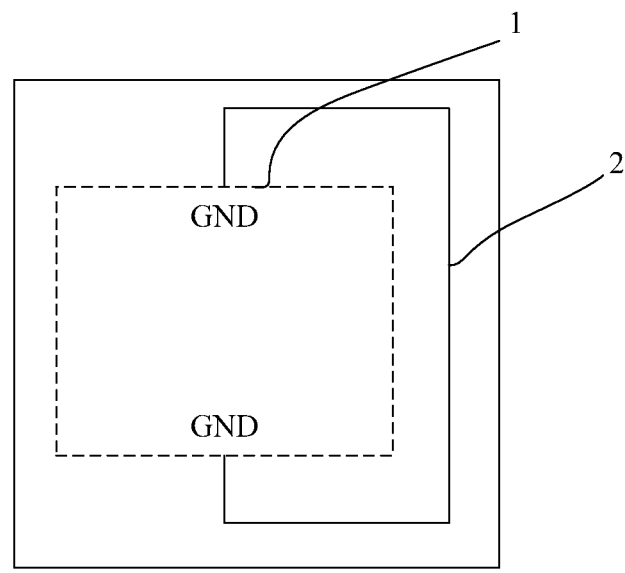
FIG. 2 is a schematic view of a back face of a PCB for an LCD device of a first example of the invention.

The invention provides an LCD device, which comprises a PCB; the PCB can be a power board or a master control board, and can be other PCBs with a component with high heat productivity. The component with high heat productivity can be an IC, a MOS transistor, etc. FIG. 1 and FIG. 2 show a first example of the PCB for an LCD device. The PCB comprises a front face and a back face; the front face of the PCB is a face for densely arranging components, and the back face is a face without densely arranged components. The component with high heat productivity is arranged on the front face of the PCB, the back face of the PCB is provided with a jumper wire for dissipating the heat, and the jumper wire is connected with a terminal of the component.

The front face of the PCB of the invention is the face for densely arranging components, and the back face is the face without densely arranged components. The component with high heat productivity is arranged on the front face of the PCB, the back face of the PCB is provided with the jumper wire, the jumper wire is connected with the terminal of the component, the heat of the component is transmitted to the jumper wire by the terminal, and the jumper wire is used for auxiliarily strengthening heat dissipation. Because the back face of the PCB is the face without densely arranged components, the temperature of the back face is lower than that of the front face of the PCB, and the temperature difference between the jumper wire and the environmental of the back face of the PCB is large. Thus, the heat is rapidly transmitted, and the heat dissipating effect is significantly improved.

In the example, the component with high heat productivity is an IC 1. The wire jumper 2 is formed by etching a copper film of the back face of the PCB, namely the wire jumper 2 is formed when manufacturing a circuit of the back face of the PCB; thus, the process is not added, and the cost is not added basically.

In the example, the jumper wire 2 is a bare metal wire; thus, the heat dissipating effect is very good. To prevent the bare jumper wire 2 from being in contact with other metal parts to cause a short circuit, the jumper wire is covered with a layer of heat-conducting insulating layer, such as a green oil.

In the example, two common ground ends of the same IC 1 are provided with the jumper wire 2, and the heat is transmitted to the jumper wire 2 from a welding point of the common ground end of the IC. The jumper wire 2 has certain length and width, namely has certain heat dissipating area, thereby strengthening heat dissipation.

Figure 3:
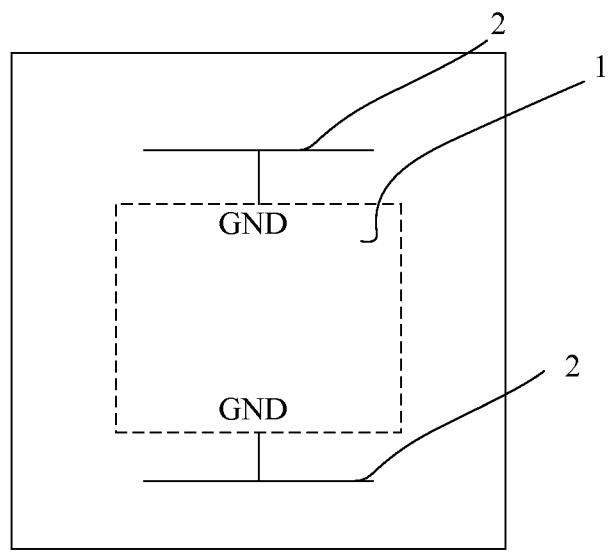
FIG. 3 is a schematic view of a back face of a PCB for an LCD device of a second example of the invention.

FIG. 3 shows a second example of the PCB for the LCD device, and the second example is different from the first example in that: the number of the jumper wire 2 is multiple, two common ground ends of the IC 1 are respectively connected with one jumper wire 2, two jumper wires 2 are not communicated, and are not connected with the terminals of other components any longer. The jumper wire 2 is in T shape or in other shapes as well. The jumper wire can obviously play a role of dissipating the heat as long as the jumper wire has certain heat dissipating area.

Figure 4:
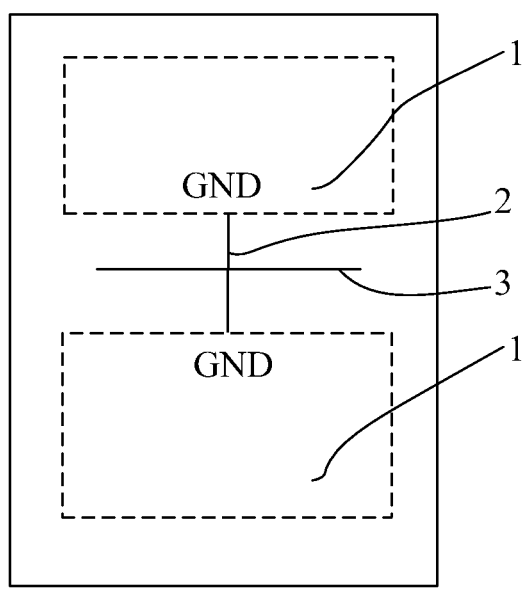
FIG. 4 is a schematic view of a back face of a PCB for an LCD device of a third example of the invention.

FIG. 4 shows a third example of the PCB for the LCD device, and the third example is different from the first example in that: the common ground ends of a plurality of components of the PCB are connected via the jumper wire. The component in the example is two ICs 1. To increase the heat dissipating area of the jumper wire 2, a branch jumper wire 3 is specially added.

In the example, the same signal ends of a plurality of components can be used to substitute the common ends of the components, and be connected via the jumper wire to dissipate the heat.

The invention is described in detail in accordance with the above contents with the specific preferred examples. However, this invention is not limited to the specific examples. For the ordinary technical personnel of the technical field of the invention, on the premise of keeping the conception of the invention, the technical personnel can also make simple deductions or replacements, and all of which should be considered to belong to the protection scope of the invention.

We claim:

1. A printed circuit board (PCB) for a Liquid Crystal Display (LCD) device, comprising: a front face and a back face; wherein said front face of said PCB is a face for densely arranging components, and said back face of said PCB is a face without densely arranged components; said back face of said PCB is provided with a jumper wire for dissipating heat, wherein said jumper wire is covered with a heat-conducting insulating layer, said jumper wire is connected with a terminal of said components, and is formed by etching a copper film of said back face of said PCB; said jumper wire is a bare metal wire; the same signal ends of said components are connected via said jumper wire, or common ground ends of said components are connected via said jumper wire; said components are an IC and/or a MOS transistor, and said PCB for said LCD device is a power board or a master control board.

2. A printed circuit board (PCB) for a Liquid Crystal Display (LCD) device, comprising: a front face and a back face; wherein said front face of said PCB is a face for densely arranging components, and said back face of said PCB is a face without densely arranged components; said back face of said PCB is provided with a jumper wire for dissipating heat, and said jumper wire is connected with a terminal of one of said components; wherein said jumper wire is covered with a heat-conducting insulating layer, wherein the same signal ends of said components are connected via said jumper wire, or common ground ends of said components are connected via said jumper wire.

3. The PCB for an LCD device of claim 2, wherein said jumper wire is formed by etching a copper film of said back face of said PCB.

4. The PCB for an LCD device of claim 2, wherein said jumper wire is not connected with terminals of the others of the components any longer.

5. The PCB for an LCD device of claim 2, wherein the number of said jumper wire is multiple.

6. The PCB for an LCD device of claim 2, wherein said components are MOS transistors.

7. The PCB for an LCD device of claim 2, wherein said PCB for said LCD device is a power board or a master control board.

8. A Liquid Crystal Display (LCD) device, comprising: a Printed circuit board (PCB); wherein said PCB comprises a front face and a back face; said front face of said PCB is a face for densely arranging components, and said back face is a face without densely arranged components; said back face of said PCB is provided with a jumper wire for dissipating heat, and said jumper wire is connected with a terminal of one of said components, wherein said jumper wire is covered with a heat-conducting insulating layer, wherein the same signal ends of said components are connected via said jumper wire or common ground ends of said components are connected via said jumper wire.

9. The LCD device of claim 8, wherein said jumper wire is formed by etching a copper film of said back face of said PCB.

10. The LCD device of claim 8, wherein said jumper wire is not connected with terminals of the others of the components any longer.

11. The LCD device of claim 8, wherein the number of said jumper wire is multiple.

12. The LCD device of claim 8, wherein said components are MOS transistors.

13. The LCD device of claim 8, wherein said PCB for said LCD device is a power board or a master control board.

* * * * *